(12) United States Patent
Kim et al.

(10) Patent No.: US 9,633,746 B2
(45) Date of Patent: Apr. 25, 2017

(54) SEMICONDUCTOR DEVICE, SEMICONDUCTOR SYSTEM INCLUDING THE SAME AND TEST METHOD THEREOF

(71) Applicant: SK hynix Inc., Gyeonggi-do (KR)

(72) Inventors: Kwang-Hyun Kim, Gyeonggi-do (KR); Kang-Youl Lee, Gyeonggi-do (KR)

(73) Assignee: SK Hynix Inc., Gyeonggi-do (KR)

(*) Notice: Subject to any disclaimer, the term of this patent is extended or adjusted under 35 U.S.C. 154(b) by 465 days.

(21) Appl. No.: 14/086,623

(22) Filed: Nov. 21, 2013

(65) Prior Publication Data

US 2015/0003171 A1    Jan. 1, 2015

(30) Foreign Application Priority Data

Jun. 28, 2013 (KR) .................. 10-2013-0075558

(51) Int. Cl.
- G11C 29/02 (2006.01)
- G11C 7/10 (2006.01)
- G11C 7/22 (2006.01)
- G11C 11/4076 (2006.01)
- G11C 11/4093 (2006.01)
- G11C 11/4096 (2006.01)

(52) U.S. Cl.
CPC .......... G11C 29/023 (2013.01); G11C 7/106 (2013.01); G11C 7/1039 (2013.01); G11C 7/1066 (2013.01); G11C 7/222 (2013.01); G11C 11/4076 (2013.01); G11C 11/4093 (2013.01); G11C 11/4096 (2013.01); G11C 29/028 (2013.01); G11C 2207/2281 (2013.01)

(58) Field of Classification Search
CPC ............................ G11C 29/023; G11C 7/1039

USPC ...................................................... 365/189.02
See application file for complete search history.

(56) References Cited

U.S. PATENT DOCUMENTS

| | | | | |
|---|---|---|---|---|
| 5,070,474 A * | 12/1991 | Tuma | .................... | G06F 3/0601 703/24 |
| 5,987,601 A * | 11/1999 | Donovan | ................ | G06F 9/462 712/244 |
| 6,326,813 B2 * | 12/2001 | Lindsay | .......................... | 326/93 |
| 6,631,090 B1 * | 10/2003 | Kwak | .................. | G11C 7/1018 365/189.05 |
| 2005/0117403 A1 * | 6/2005 | Fujisawa | .............. | G11C 7/1012 365/189.05 |
| 2012/0250435 A1 * | 10/2012 | Matsunaga | ............... | G11C 7/12 365/194 |

FOREIGN PATENT DOCUMENTS

KR    1020050082599    8/2005

* cited by examiner

*Primary Examiner* — Hoai V Ho
*Assistant Examiner* — Muna A Techane
(74) *Attorney, Agent, or Firm* — I P & T Group LLP

(57) ABSTRACT

A semiconductor device includes a memory region suitable for providing a plurality of read data in parallel at every read operation cycle, an output path suitable for outputting the plurality of read data at a set time in response to an internal clock and one or more internal control signals at the every read operation cycle, and an output path control unit suitable for generating the internal control signal in response to a read command and generating the internal clock in response to a system clock, wherein a shifting time of a first edge of the internal clock is adjusted by a set level at the every read operation cycle during a test mode.

12 Claims, 9 Drawing Sheets

SEMICONDUCTOR DEVICE, SEMICONDUCTOR SYSTEM INCLUDING THE SAME AND TEST METHOD THEREOF

CROSS-REFERENCE TO RELATED APPLICATIONS

The present application claims priority of Korean Patent Application No. 10-2013-0075558, filed on Jun. 28, 2013, which is incorporated herein by reference in its entirety.

BACKGROUND

1. Field

Exemplary embodiments of the present invention relate to a semiconductor design technology, and more particularly, to a semiconductor device, a semiconductor system including the same and a test method thereof.

2. Description of the Related Art

In general, a semiconductor device such as a dynamic random access memory (DRAM) may store data temporarily or permanently on a memory cell region thereof. The semiconductor device is used in various electronic devices such as a computer system. The semiconductor device outputs a stored data or stores an input data on a memory cell in response to a write command or a read command and an address, which are provided from an external control device or a processor.

As an operation speed of the semiconductor device and the processor is increased, a technique for inputting or outputting a lot of data rapidly is being developed.

However, the semiconductor device communicates data with an external device through a limited path, e.g., a pin or a pad, and the amount of data is increased as compared with an input command.

Thus, various devices for raising a data input/output speed of the semiconductor device are arranged in the semiconductor device, and various parameters for an internal operation of the semiconductor device are regulated to raise the operation stability of the semiconductor device.

For example, a parameter of an address access delay time (tAA) is regulated as a spec. The address access time (tAA) is defined by a time from when a read command is inputted until when a first data is outputted through a data output pad in response the read command. A column access strobe latency (CL) represents the address access time (tAA) by using a clock unit.

SUMMARY

Exemplary embodiments of the present invention are directed to a semiconductor device, a semiconductor system including the same and a test method thereof for measuring an address access time (tAA) at a wafer level.

In accordance with an embodiment of the present invention, a semiconductor device includes a memory region suitable for providing a plurality of read data in parallel at every read operation cycle, an output path suitable for outputting the plurality of read data at a set time in response to an internal clock and one or more internal control signals at the every read operation cycle, and an output path control unit suitable for generating the internal control signal in response to a read command and generating the internal clock in response to a system clock, wherein a shifting time of a first edge of the internal clock is adjusted by a set level at the every read operation cycle during a test mode.

In accordance with another embodiment of the present invention, a semiconductor system includes a semiconductor device suitable for outputting a valid signal synchronized with a first edge of a system clock at every set operation cycle, and a test device suitable for generating the system clock of which a shifting time of the first edge is adjusted by a set level at the every set operation cycle, and testing the semiconductor device based on the valid signal.

In accordance with further embodiment of the present invention, a test method of a semiconductor system comprising a semiconductor device and a test device includes inputting a system clock and a command synchronized with the system clock to the semiconductor device, outputting data of the semiconductor device, which is synchronized with a first edge of the system clock, to the test device, wherein the first edge includes an edge of the system clock at which the system clock is shifted first after a set latency passes from when the command is inputted, performing repeatedly the inputting of the system clock and the command and adjusting the first edge of the system clock by a set level whenever repeatedly performed, and testing the semiconductor device based on the data outputted when the first edge of the system clock is adjusted.

DETAILED DESCRIPTION

Figure 1:
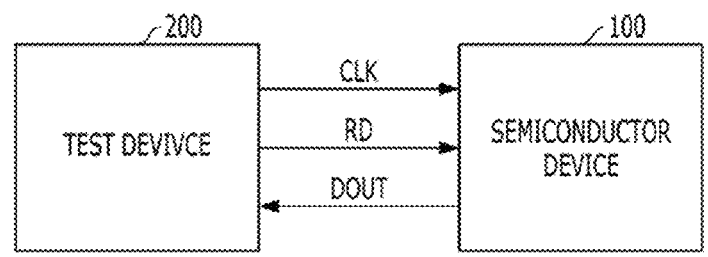
FIG. 1 is a block diagram illustrating a semiconductor system in accordance with an embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, reference numerals correspond directly to the like parts in the various figures and embodiments of the present invention. It is also noted that in this specification, "connected/coupled" refers to one component not only directly coupling another component but also indirectly coupling another component through an intermediate component. In addition, a singular form may include a plural form as long as it is not specifically mentioned in a sentence.

FIG. 1 is a block diagram illustrating a semiconductor system in accordance with an embodiment of the present invention. Referring to FIG. 1, a semiconductor system in accordance with an embodiment of the present invention includes a semiconductor device 100 and a test device 200.

The semiconductor device 100 of a wafer level outputs a read data DOUT synchronized with a falling edge of a system clock CLK at every read operation cycle. More specifically, the semiconductor device 100 outputs a read data DOUT to the test device 200 based on a CAS latency (CL) corresponding to a single period of a system clock CLK at every read operation cycle.

If the semiconductor device 100 enters a predetermined test mode, the semiconductor device 100 outputs a read data DOUT to the test device 200 based on a CAS latency (CL) corresponding to a half period of a system clock CLK at every read operation cycle. That is, during the predetermined test mode, the semiconductor device 100 arranges the read data DOUT synchronized with a rising edge of the system clock CLK in response to a read command RD, and outputs the read data DOUT synchronized with a falling edge of the system clock CLK to the test device 200.

Hereinafter, the predetermined test mode is referred to as a 'TCL05' mode, and a case that the semiconductor device 100 does not enter the predetermined test mode is referred to as 'TCL10' mode. For reference, the 'TCL10' mode is set as a default value in the semiconductor device 100 when the semiconductor device 100 performs various test operations at a wafer level.

The test device 200 provides the read command RD and a system clock CLK to the semiconductor device 100. A shifting time of a falling edge of the system clock CLK is adjusted by a predetermined level at every read operation cycle. The test device 200 detects an address delay time (tAA) as one of asynchronous parameters based on the read data DOUT provided from the semiconductor device 100.

More specifically, the test device 200 provides the system clock CLK of a low frequency useful for a test operation and the read command RD synchronized with a rising edge of the system clock CLK to the semiconductor device 100. Moreover, the test device 200 provides various signals (not shown) for the test operation to the semiconductor device 100. The test device 200 detects the address access time (tAA) of the semiconductor device 100 based on a valid output data window (tDV) of the read data DOUT.

Figure 2:
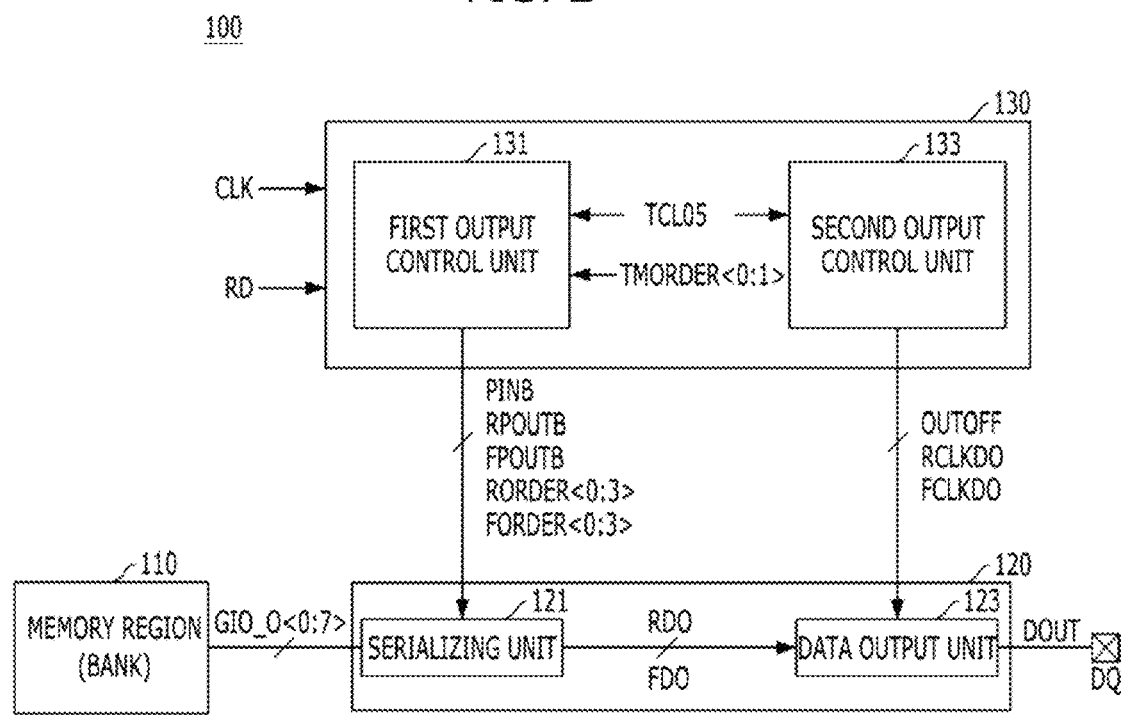
FIG. 2 is a block diagram illustrating a semiconductor device shown in FIG. 1.

FIG. 2 is a block diagram illustrating the semiconductor device 100 shown in FIG. 1. Referring to FIG. 2, the semiconductor device 100 includes a memory region 110, an output path 120, and an output path control unit 130.

The memory region 110 provides first to eighth internal data to first to eighth global lines GIO_O<0:7> at every read operation cycle.

The output path 120 outputs the read data DOUT corresponding to the first to eighth internal data loaded on the first to eighth global lines GIO_O<0:7> to a data output pad DQ at every read operation cycle in response to internal clocks RCLKDO and FCLKDO and first to fifth internal control signals PINB, RPOUTB, FPOUTB, RORDER<0:3> and FORDER<0:3>. The output path 120 includes a serialization unit 121 and an output unit 123.

The serialization unit 121 outputs in series the first to eighth internal data loaded on the first to eighth global lines GIO_O<0:7> as serial data RDO and FDO in response to the first to fifth internal control signals PINB, RPOUTB, FPOUTB, RORDER<0:3> and FORDER<0:3>. The serialization unit 121 outputs only the first internal data of the first to eighth internal data during a 'TCL05' mode.

The output unit 123 synchronizes serial data RDO and FDO outputted through the serialization unit 121 with the internal clocks RCLKDO and FCLKDO and outputs synchronized serial data DOUT to the data output pad DQ.

The output path control unit 130 generates the internal clocks RCLKDO and FCLKDO and the first to fifth internal control signals in response to the read command RD and the system clock CLK. The output path control unit 130 includes a first output control unit 131 and a second output control unit 133.

The first output control unit 131 generates the first to fifth internal control signals PINB, RPOUTB, FPOUTB, RODER<0:3> and FORDER<0:3> in response to the read command RD and the system clock CLK. The first output control unit 131 controls the first to fifth internal control signals PINB, RPOUTB, FPOUTB, RODER<0:3> and FORDER<0:3> to be activated according to the 'TCL05' mode in response to first and second test mode signals TCL05 and TMORDER<0:1>.

The second output control unit 133 generates the internal clocks RCLKDO and FCLKDO in response to the first test mode signal TCL05 and the system clock CLK. The second output control unit 133 may generate an output control signal OUTOFF for controlling an output period of the data output unit 123.

Figure 3:
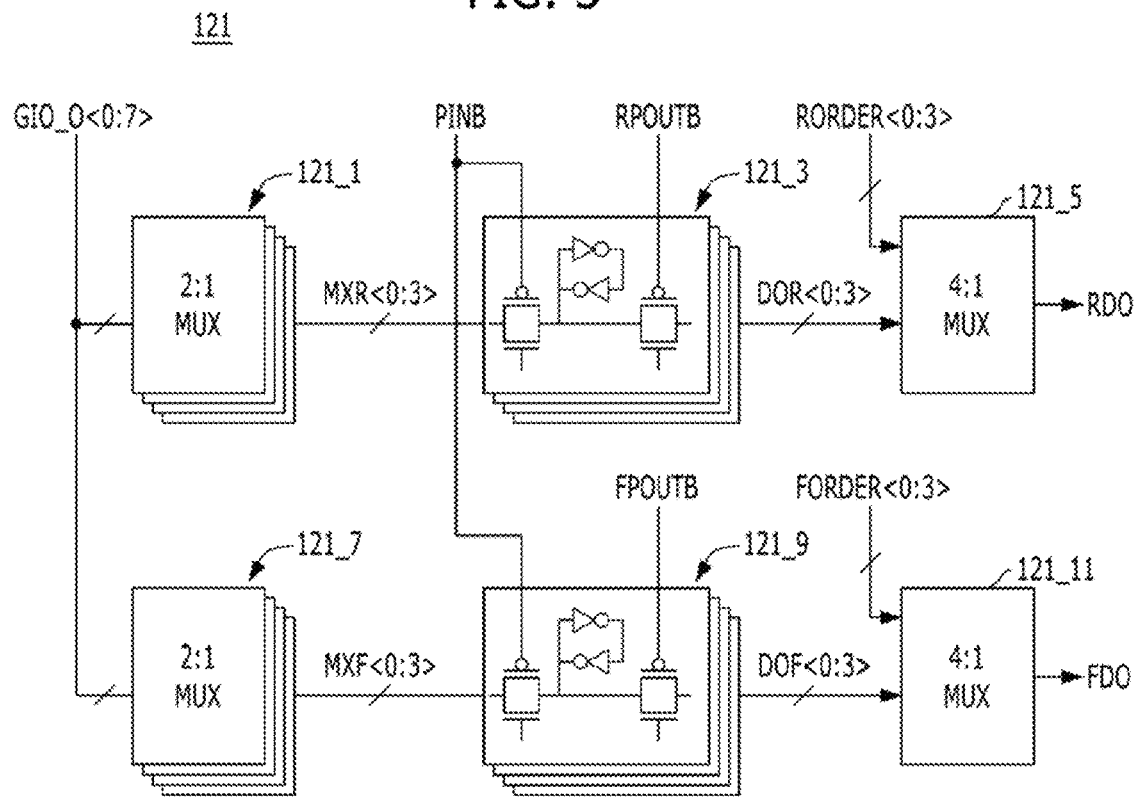
FIG. 3 is a circuit diagram illustrating a serialization unit shown in FIG. 2.

FIG. 3 is a circuit diagram illustrating the serialization unit 121 shown in FIG. 2. Referring to FIG. 3, the serialization unit 121 includes a first multiplexing unit 121_1, a first pipe latch unit 121_3, a second multiplexing unit 121_5, a third multiplexing unit 121_7, a second pipe latch unit 121_9, and a fourth multiplexing unit 121_11.

The first multiplexing unit 121_1 selects a half of the first to eighth internal data loaded on the first to eighth global lines GIO_O<0:7>, and outputs first to fourth selected data MXR<0:3>.

The first pipe latch unit 121_3 arranges the first to fourth selected data MXR<0:3>, which are outputted from the first multiplexing unit 121_1, in response to the first internal control signal PINB, and outputs first to fourth arranged data DOR<0:3> in response to the second internal control signal RPOUTB.

The second multiplexing unit 121_5 transfers in series the first to fourth arranged data DOR<0:3>, which are outputted from the first pipe latch unit 121_3, as a first serial data RDO to the data output unit 123 in a predetermined burst sequence in response to the third internal control signal RORDER<0:3>.

The third multiplexing unit 121_7 selects the other half of the first to eighth internal data loaded on the first to eighth global lines GIO_O<0:7>, and outputs fifth to eighth selected data MXF<0:3>.

The second pipe latch unit 121_9 arranges the fifth to eighth selected data MXF<0:3>, which are outputted from the third multiplexing unit 121_7, in response to the first internal control signal PINB, and outputs fifth to eighth arranged data DOF<0:3> in response to the fourth internal control signal FPOUTB.

The fourth multiplexing unit 121_11 transfers in series the fifth to eighth arranged data DOF<0:3>, which are outputted from the second pipe latch unit 121_9, as a second serial data FDO to the data output unit 123 in the predetermined burst sequence in response to the fifth internal control signal FORDER<0:3>.

Figure 4:
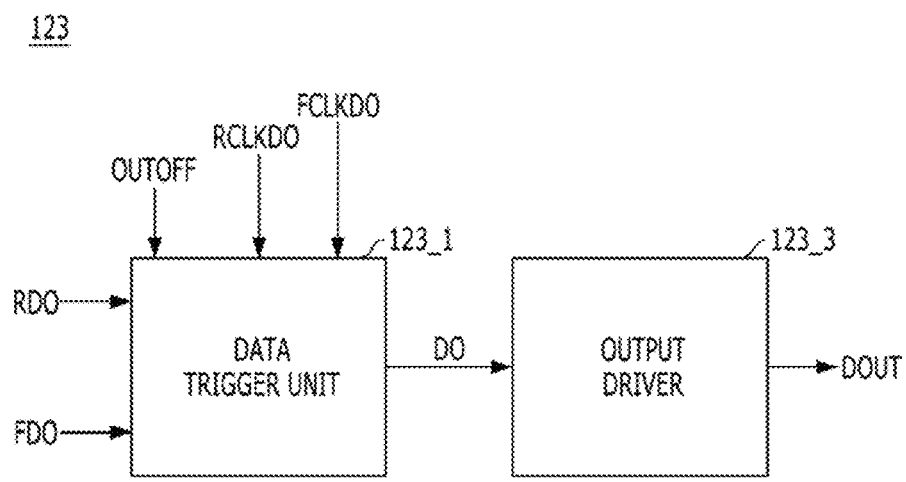
FIG. 4 is a block diagram illustrating a data output unit shown in FIG. 2.

FIG. 4 is a block diagram illustrating the data output unit 123 shown in FIG. 2. Referring to FIG. 4, the data output unit includes a data trigger unit 123_1 and an output driver 123_3.

The data trigger unit 123_1 synchronizes the first and second serial data ROD and FDO with the Internal clocks RCLKDO and FCLKDO and outputs a synchronized data DO in response to an output control signal OUTOFF.

The output driver 123_3 drives the synchronized data DO outputted from the data trigger unit 123_1 to the data output pad DQ.

Figure 5:
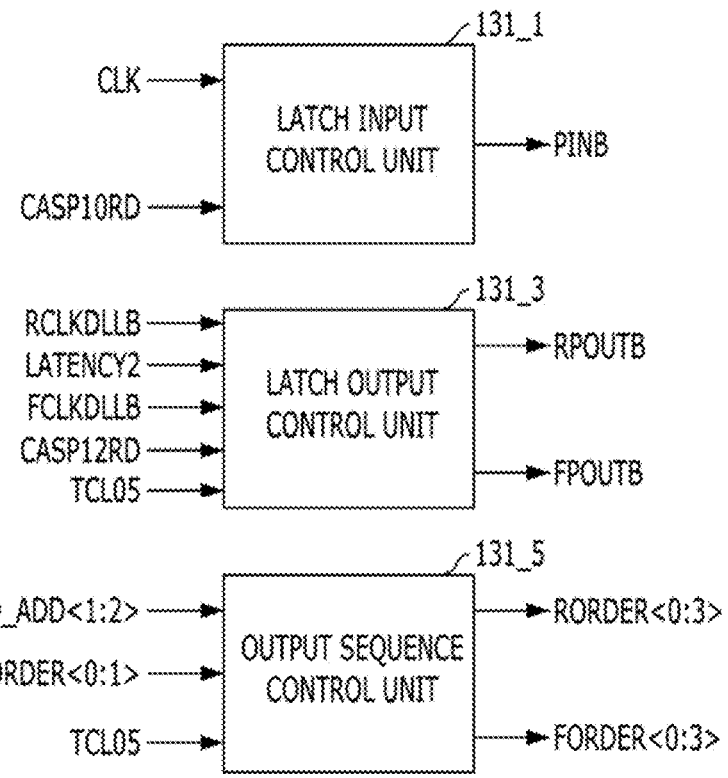
FIG. 5 is a block diagram Illustrating a first output control unit shown in FIG. 2.

FIG. 5 is a block diagram illustrating the first output control unit 131 shown in FIG. 2. Referring to FIG. 5, the first output control unit 131 includes a latch input control unit 131_1, a latch output control unit 131_3, and an output sequence control unit 131_5.

The latch input control unit 131_1 generates the first internal control signal PINB in response to the system clock CLK and a first internal command CASP10RD, which is synchronized with the system clock CLK and is derived from the read command RD.

The latch output control unit 131_3 generates the second internal control signal RPOUTB and the fourth internal control signal FPOUTB in response to the first test mode signal TCLK05, first and second inverted delay locking clocks RCLKDLLB and FCLKDLLB, a second internal command LATENCY2, and a third internal command CASP12RD. Herein, the first and second inverted delay locking clocks RCLKDLLB and FCLKDLLB are derived from a delay locking clock CLKDLL which is generated from the system clock CLK by reflecting an internal delay element. The second internal command LATENCY2 is derived from the read command RD and is synchronized with the delay locking clock CLKDLL. The third internal command CASP12RD is derived from the read command RD and is synchronized with the system clock CLK.

The output sequence control unit 131_5 generates the third internal control signal RORDER<0:3> and the fifth internal control signal FORDER<0:3> in response to a seed address SEDD_ADD<1:2>, the first test mode signal TCL05, and the second test mode signal TMORDER<0:1>.

Herein, the second to fifth internal control signals RPOUTB, RORDER<0:3>, FPOUTB and FORDER<0:3> except the first internal control signal PINB are adjusted during the 'TCL05' mode. Hereinafter, the latch output control unit 131_3 for generating the second internal control signal RPOUTB and the fourth internal control signal FPOUTB, and the output sequence control unit 13_5 for generating the third internal control signal RORDER<0:3> and the fifth internal control signal FORDER<0:3> will be described.

Figure 6:
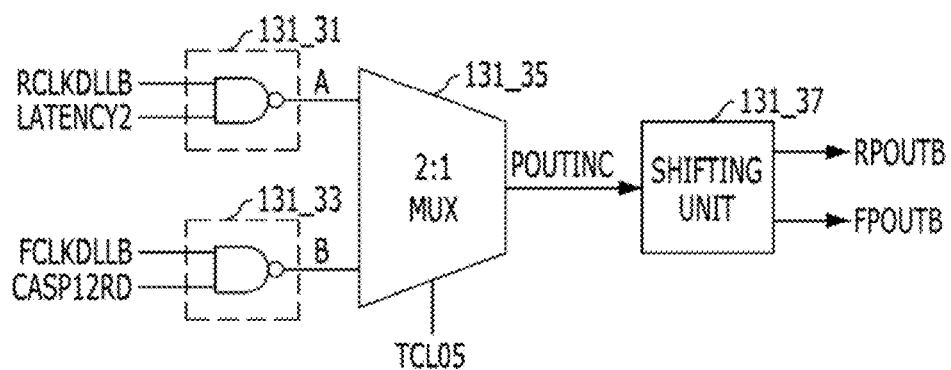
FIG. 6 is a circuit diagram illustrating a latch output control unit shown in FIG. 5.

FIG. 6 is a circuit diagram illustrating the latch output control unit 131_3 shown in FIG. 5. Referring to FIG. 6, the latch output control unit 131_3 includes a first logic operation unit 131_31, a second logic operation unit 131_33, a fifth multiplexing unit 131_35, and a shifting unit 131_37.

The first logic operation unit 131_31 performs a NAND operation on the second internal command LATENCY2 and the first inverted delay locking clock RCLKDLLB, and outputs a first logic operation signal A. The second logic operation unit 131_33 performs a NAND operation on the third internal command CASP12RD and the second inverted delay locking clock FCLKDLLB, and outputs a second logic operation signal B.

The fifth multiplexing unit 131_35 outputs selectively one of the first logic operation signal A and the second logic operation B as a source signal POUTINC in response to the first test mode signal TCL05.

The shifting unit 131_37 generates the second internal control signal RPOUTB and the fourth internal control signal FPOUTB in response to the source signal POUTINC outputted from the fifth multiplexing unit 131_35.

Especially, the latch output control unit 131_3 outputs the second internal control signal RPOUTB and the fourth internal control signal FPOUTB corresponding to the first logic operation signal A in case of 'TCL10' mode, and outputs the second internal control signal RPOUTB and the fourth internal control signal FPOUTB corresponding to the second logic operation signal B in case of 'TCL05' mode.

For example, the latch output control unit 131_3 outputs the second internal control signal RPOUTB and the fourth internal control signal FPOUTB in case of 'TCL05' mode, which are prior to the second internal control signal RPOUTB and the fourth internal control signal FPOUTB in case of 'TCL10' mode by a half period of the system clock CLK.

Figure 7:
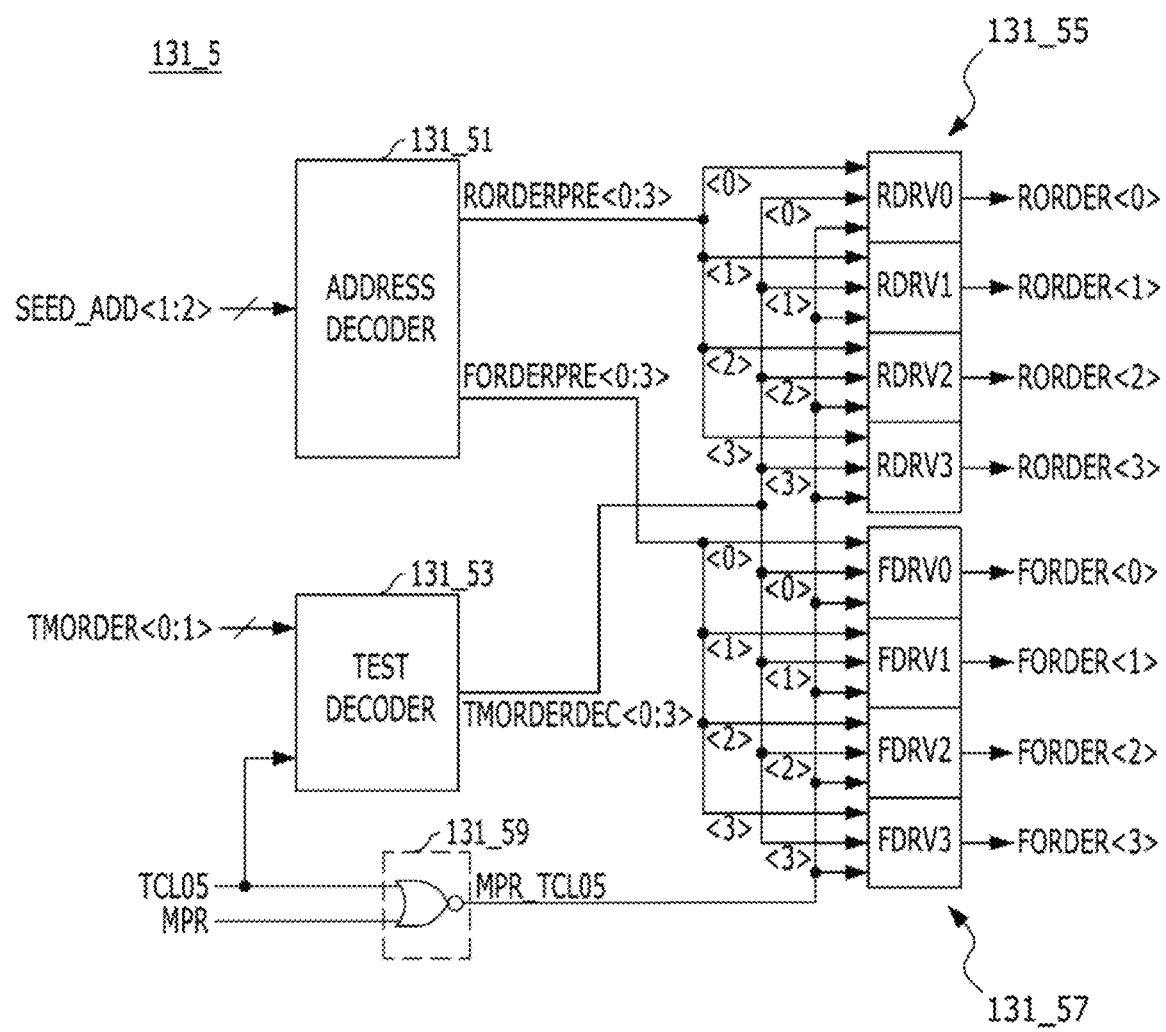
FIG. 7 is a circuit diagram illustrating an output sequence control unit shown in FIG. 5.
Figure 8:
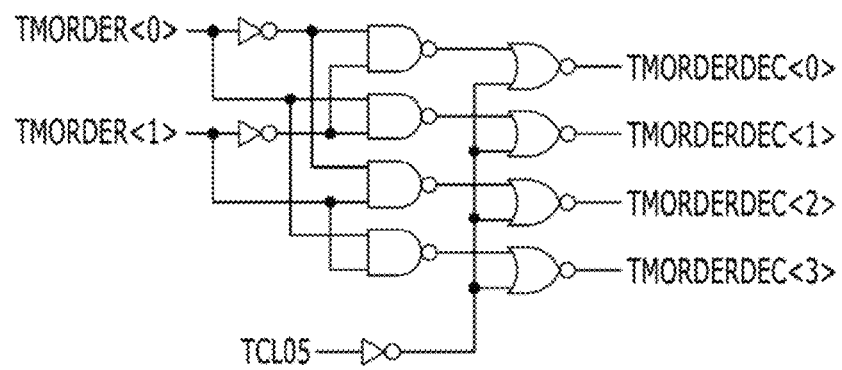
FIG. 8 is a circuit diagram illustrating a test decoder shown in FIG. 7.
Figure 9:
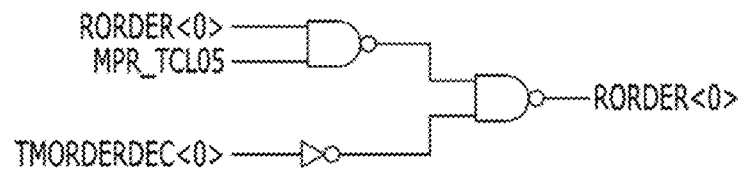
FIG. 9 is a circuit diagram illustrating a first output unit shown in FIG. 7.

FIG. 7 is a circuit diagram Illustrating the output sequence control unit 131_5 shown in FIG. 5. FIG. 8 is a circuit diagram Illustrating a test decoder shown in FIG. 7. FIG. 9 is a circuit diagram illustrating a first output unit shown in FIG. 7.

Referring to FIG. 7, the output sequence control unit 131_5 includes an address decoder 131_51, a test decoder 131_53, a first selection output unit 131_55, a second selection output unit 131_57, and a third logic operation unit 131_59.

The address decoder 131_51 generates first and second code signals RORDERPRE<0:3> and FORDERPRE<0:3> corresponding to the seed address SEED_ADD<1:2>.

The test decoder 131_53 generates a common code signal TMORDERDEC<0:3> corresponding to the second test mode signal TMORDER<0:1> in response to the first test mode signal TCL05.

The first selection output unit 131_55 outputs one of the common code signal TMORDERDEC<0:3> and the first code signal RORDERPRE<0:3> in response to a selection signal MPR_TCL05.

The second selection output unit 131_57 outputs one of the common code signal TMORDERDEC<0:3> and the second code signal FORDERPRE<0:3> in response to the selection signal MPR_TCL05.

The third logic operation unit 131_59 performs a NAND operation on the first test mode signal TCL05 and a specific mode signal MPR, and outputs the selection signal MPR_TCL05.

Herein, as shown in FIG. 8, the test decoder 131_53 includes logic elements for decoding the second test mode signal TMORDER<0:1> and logic elements for controlling an output of the common code signal TMORDERDEC<0:3> in response to the first test mode signal TCL05.

As shown in FIG. 7, the first selection output unit 131_55 includes first to fourth output units RDRV0 to RDRV3 in response to the common code signal TMORDERDEC<0:3> and the first code signal RORDEPRE<0:3>. The second selection output unit 131_57 includes fifth to eighth output units FDRV0 to FDRV3 in response to the common code signal TMORDERDEC<0:3> and the second code signal FORDERPRE<0:3>.

Since the first to eighth output units RDRV0 to RDRV3 and FDRV0 to FDRV3 have substantially the same configuration, only the first output unit RDRV0 is exemplarily shown in FIG. 9, and the detailed descriptions of the first output unit RDRV0 will be omitted.

Figure 10:
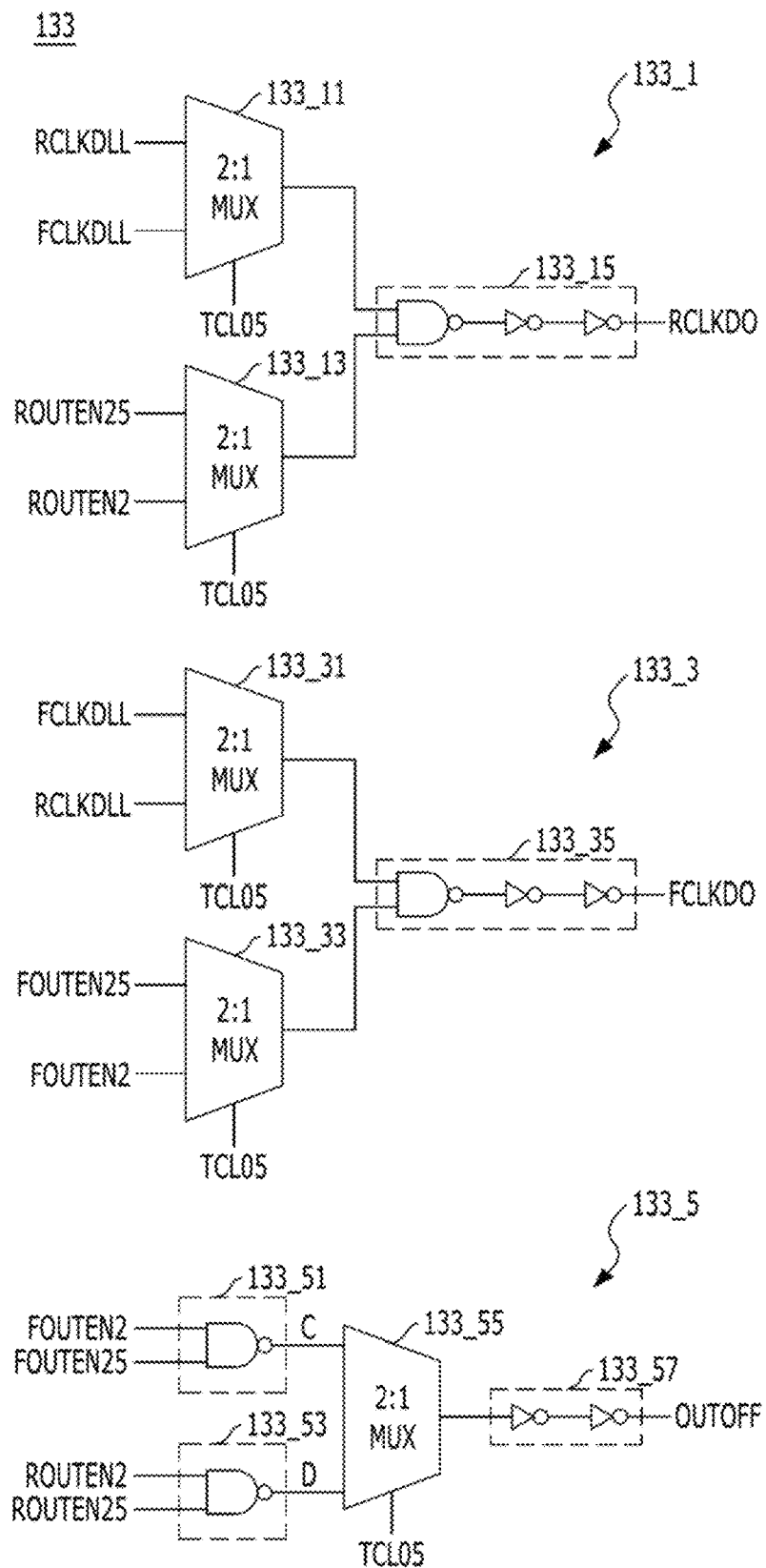
FIG. 10 is a circuit diagram illustrating a second output control unit shown in FIG. 2.

FIG. 10 is a circuit diagram illustrating the second output control unit 133 shown in FIG. 2. Referring to FIG. 10, the second output control unit 133 includes a first internal clock generation unit 133_1, a second internal clock generation unit 133_3, and an output enable unit 133_5.

The first internal clock generation unit 133_1 generates a first internal clock RCLKDO in response to the first test mode signal TCL05, first and second output enable signals ROUTEN2 and ROUTEN25, and the first and second delay locking clocks RCLKDLL and FCLKDLL. Herein, the first and second output enable signals ROUTEN2 and ROUTEN25 are delayed to be different from each other by a half period of the system clock CLK. The first Internal clock generation unit 133_1 includes a sixth multiplexing unit 133_11, a seventh multiplexing unit 133_13, and a fourth logic operation unit 133_15.

The sixth multiplexing unit 133_11 outputs selectively one of the first and second delay locking clocks RCLKDLL and FCLKDLL in response to the first test mode signal TCL05.

The seventh multiplexing unit 133_13 outputs selectively one of the first and second output enable signals ROUTEN2 and ROUTEN25 in response to the first test mode signal TCL05.

The fourth logic operation unit 133_15 performs a NAND operation on an output signal of the sixth multiplexing unit 133_11 and an output signal of the seventh multiplexing unit 133_13, and outputs the first internal clock RCLKDO.

The second internal clock generation unit 133_3 generates a second internal clock FCLKDO in response to the first test mode signal TCL05, third and fourth enable signals FOUTEN2 and FOUTEN25, and the first and second delay locking clocks RCLKDLL and FCLKDLL. Herein, the third and fourth enable signals FOUTEN and FOUTEN25 are delayed to be different from each other by a half period of the system clock CLK. The second internal clock generation unit 133_3 includes eighth multiplexing unit 133_31, a ninth multiplexing unit 133_33, and a fifth logic operation unit 133_35.

The eighth multiplexing unit 133_31 outputs selectively one of the first and second delay locking clocks RCLKDLL and FCLKDLL in response to the first test mode signal TCL05.

The ninth multiplexing unit 133_33 outputs selectively one of the third and fourth output enable signals FOUTEN2 and FOUTEN25 in response to the first test mode signal TCL05.

The fifth logic operation unit 133_35 performs a NAND operation on an output signal of the eighth multiplexing unit 133_31 and an output signal of the ninth multiplexing unit 133_33, and outputs the second internal clock FCLKDO.

The output enable unit 133_5 generates the output control signal OUTOFF in response to the first test mode signal TCL05 and the first to fourth output enable signals ROUTEN2, ROUTEN25, FOUTEN2 and FOUTEN25. The output enable unit 133_5 includes a sixth logic operation unit 133_51, a seventh logic operation unit 133_53, a tenth multiplexing unit 133_55, and an output unit 133_57.

The sixth logic operation unit 133_51 performs a NAND operation on the third and fourth output enable signals FOUTEN2 and FOUTEN25, and outputs a sixth logic operations signal C.

The seventh logic operation unit 133_53 performs a NAND operation on the first and second output enable signals ROUTEN2 and ROUTEN25, and outputs a seventh logic operation signal D.

The tenth multiplexing unit 133_55 outputs selectively one of the sixth and seventh logic operation signals C and D in response to the first test mode signal TCL05.

The output unit 133_57 outputs an output signal of the tenth multiplexing unit 133_55 as the output control signal OUTOFF.

Hereinafter, a test method of a semiconductor system having an aforementioned configuration will be described with reference to FIGS. 11 to 14 in accordance with another embodiment of the present invention.

Figure 11:
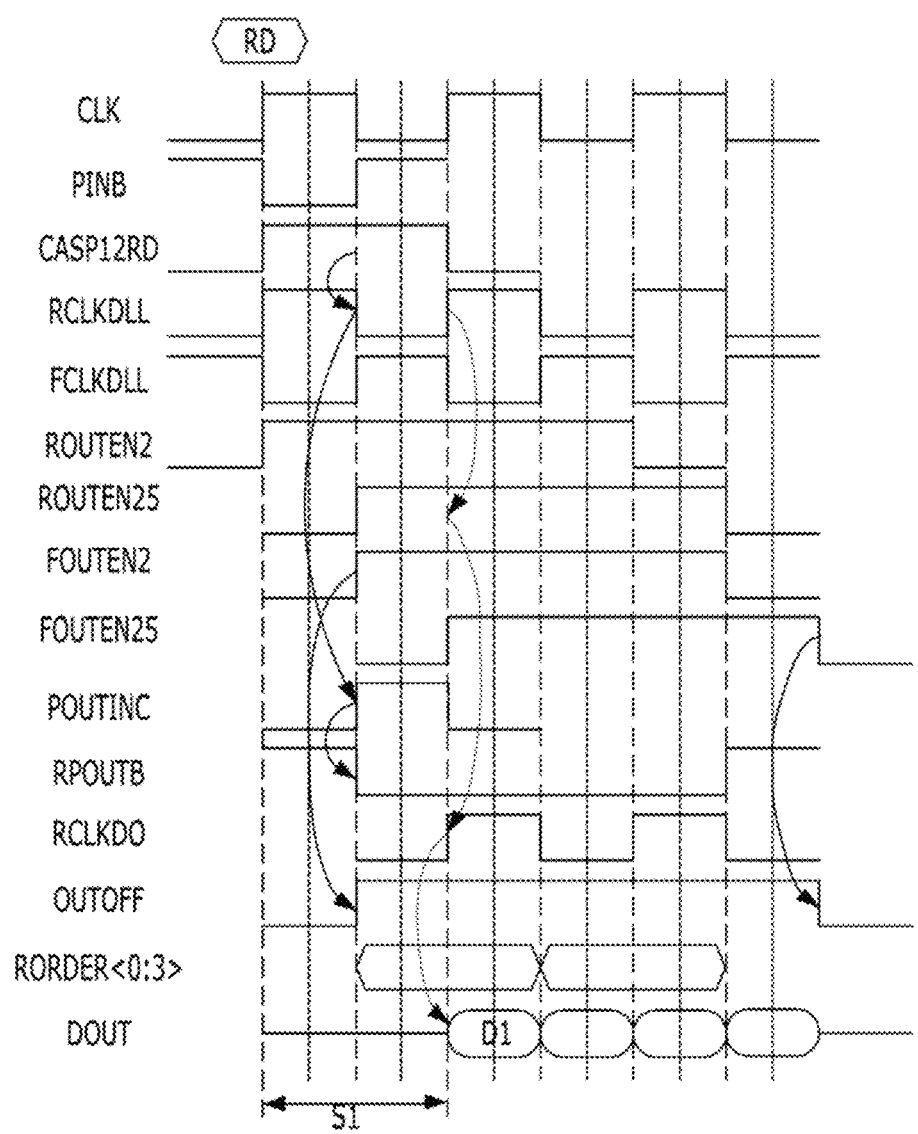
FIG. 11 is a timing diagram illustrating an operation of a semiconductor device according to a 'TCL10' mode in accordance with another embodiment of the present invention.
Figure 12:
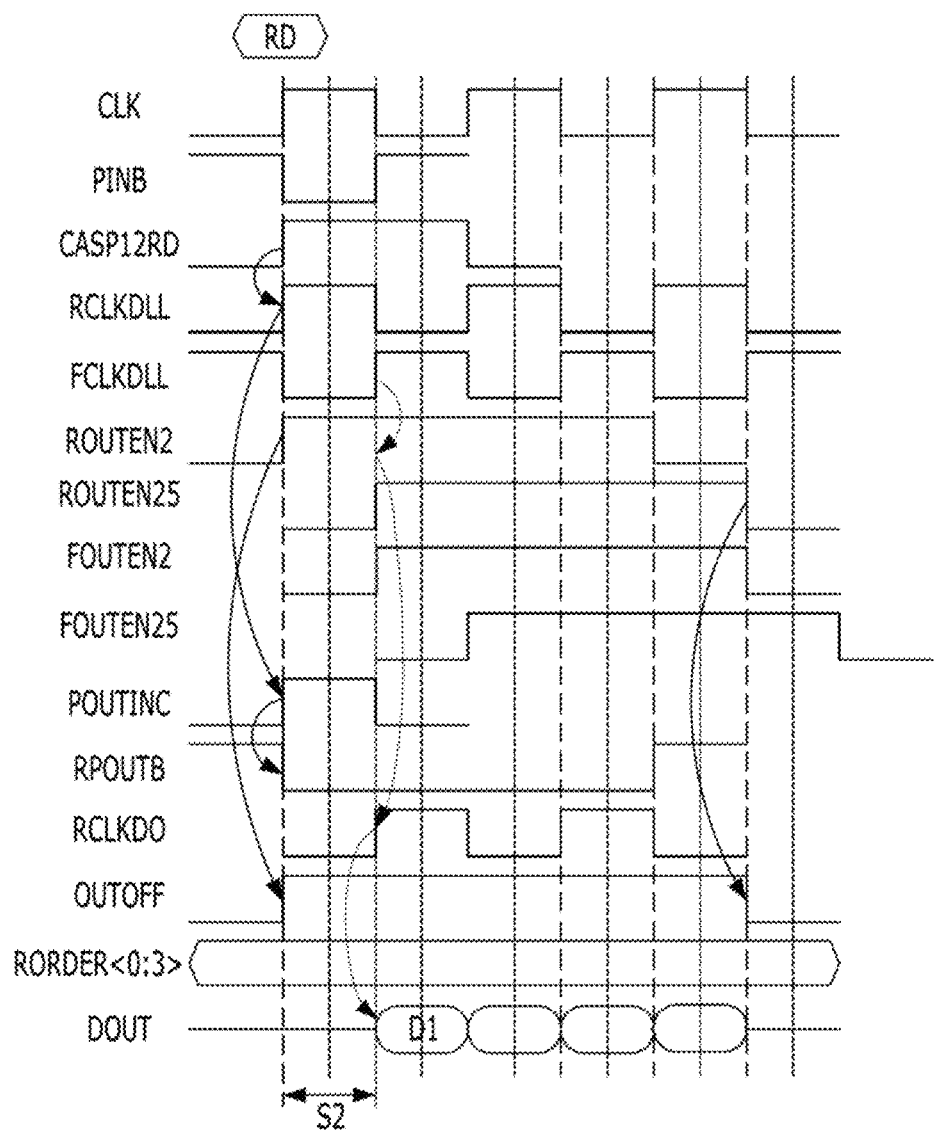
FIG. 12 is a timing diagram illustrating an operation of a semiconductor device according to a 'TCL05' mode in accordance with another embodiment of the present invention.
Figure 13:
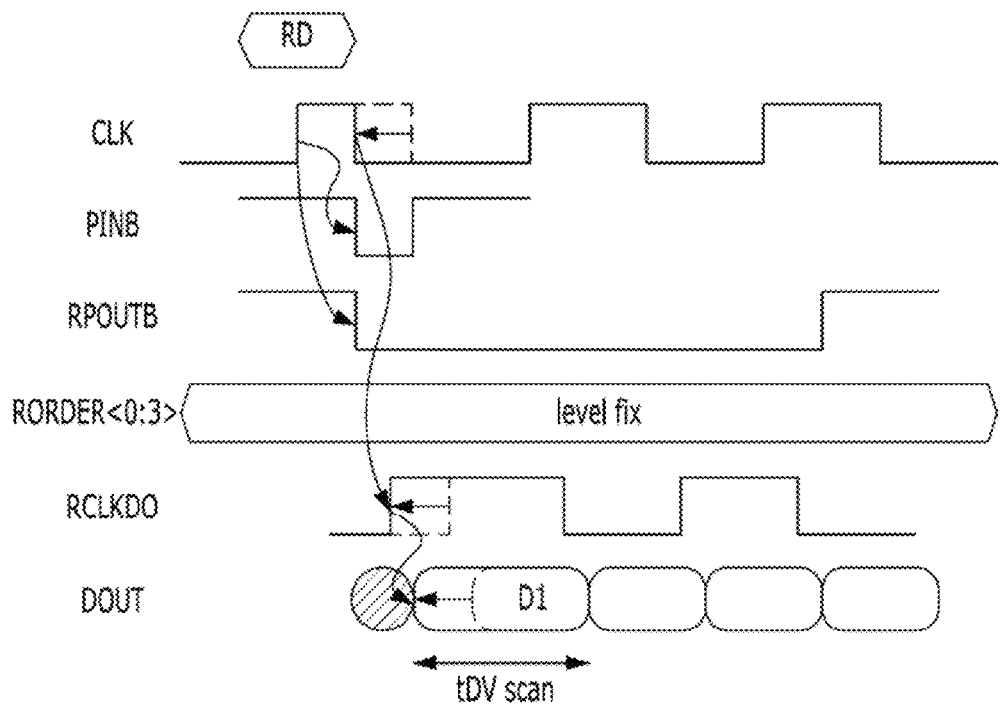
FIGS. 13 and 14 are timing diagrams illustrating a test method of a semiconductor system based on the operation of the semiconductor device shown in FIG. 12.
Figure 14:
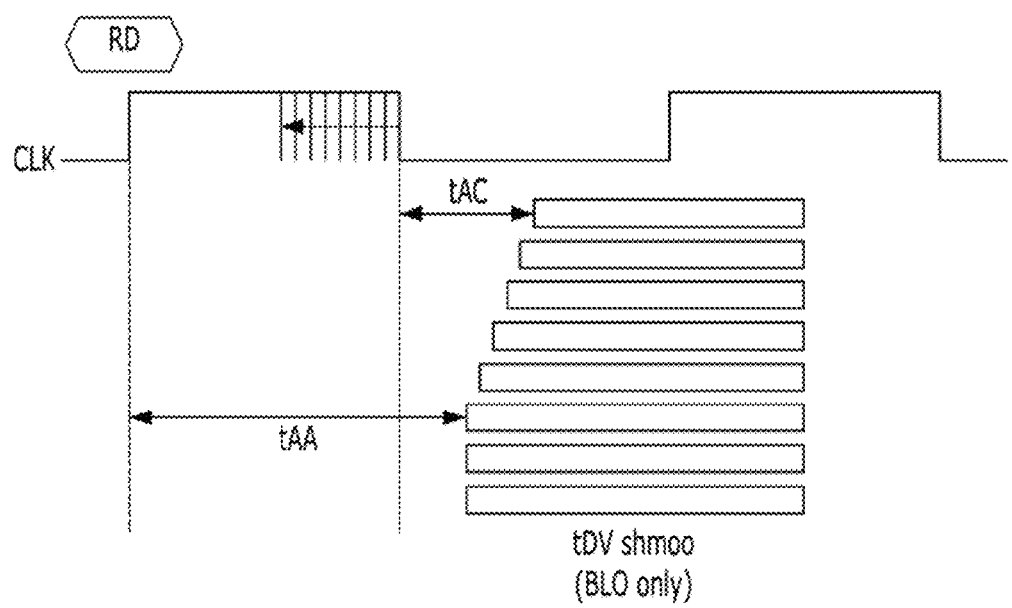

FIG. 11 is a timing diagram illustrating an operation of a semiconductor device according to a 'TCL10' mode in accordance with another embodiment of the present invention. FIG. 12 is a timing diagram Illustrating an operation of a semiconductor device according to a 'TCL05' mode in accordance with another embodiment of the present invention. FIGS. 13 and 14 are timing diagrams illustrating a test method of a semiconductor system based on an operation of a semiconductor device according to a 'TCL05' mode in accordance with another embodiment of the present invention.

Embodiments of the present Invention will be described on the basis of a first output read data D1 (hereinafter, referred to as 'first read data') of output read data (DOUT) having a predetermined burst length, e.g., BL4, since only the first read data D1 relates to an address access time (tAA).

Firstly, a read operation of the semiconductor device according to 'TCL10' mode will be described.

Referring to FIG. 11 and FIG. 1, when the test device 200 provides a system clock CLK of a low frequency to the semiconductor device 100, the test device 200 provides a read command RD synchronized with a rising edge (hereinafter, referred to as 'first rising edge') of the system clock CLK to the semiconductor device 100. The semiconductor device 100 outputs the first read data D1 synchronized with a rising edge (hereinafter, referred to as 'second rising edge') of the system clock CLK after a predetermined CAS latency (CL) passes from when the read command is provided. Herein, the predetermined CAS latency corresponds to one period of the system clock CLK.

Hereinafter, detailed operation of the semiconductor device 100 will be described as below with reference to FIG. 11 and FIG. 2.

If the read command RD is inputted to the semiconductor device 100, the first output control unit 131 generates the first internal control signal PINB corresponding to the first rising edge of the system clock CLK, and the second and third internal control signals RPOUTB and RORDER<0:3> corresponding to a falling edge (hereinafter, referred to as 'first falling edge') of the system clock CLK after a half clock passes from the first rising edge of the system clock CLK, and the second output control unit 133 generates the first internal clock RCLKDO toggled corresponding to the second rising edge of the system clock CLK.

If the read command RD is inputted to the semiconductor device 100, the memory region 110 transfers the first to eighth internal data to the firs to eighth global lines GIO_O<0:7>. The serialization unit 121 aligns the first to eighth internal data loaded on the first to eighth global lines GIO_O<0:7> in response to the first internal control signal PINB, and outputs in series aligned first to eighth internal data as the serial data RDO in response to the second and third internal control signals RPOUTB and RORDER<0:3>.

The data output unit 123 synchronizes the serial data RDO with the first internal clock RCLKDO and outputs the first read data D1.

The first read data D1 is outputted through the data output pad DQ after the CAS latency (CL) corresponding to one period of the system clock passes from when the read command RD is inputted.

Since the 'TCL10' mode is difficult to lead to a data fail circumstance, the 'TCL10' mode is not suitable for a test method for detecting the address access time (tAA) of a semiconductor device in accordance with an embodiment of the present invention.

Herein, the data fail circumstance may be caused by advancing an output start time of the first read data D1 by a predetermined level at a time until unexpected value of the first read data D1 is outputted. That is, if a timing margin between the first internal clock RCLKDO and the data aligned on the first pipe latch unit 121_3 by the first internal control signal PINB is narrowed, the data fail circumstance of the first read data D1 may occur. This will be described in more details as below (with reference to FIGS. 13 and 14).

In other words, in the 'TCL10' mode, since an internal time (Si) between an aligned time of the first to eighth internal data at the serialization unit 121 and an output time of the read data DOUT at the data output unit 123 corresponds to one period of the system clock CLK, and the address access time (tAA) of the semiconductor device 100 is shorter than one period of the system clock CLK, it is difficult to cause the data fail circumstance within a clock edge, which capable of being adjusted by the test device 200. If the semiconductor device 100 does not cause the data fail circumstance, the test device 200 may not detect the address access time (tAA) of the semiconductor device. Thus, in the embodiments of the present invention, a test method is additionally provided based on 'TCL05' mode.

Hereinafter, a read operation of a semiconductor device 100 according to the 'TCL05' mode will be described.

Referring to FIG. 12 and FIG. 1, the semiconductor device 100 enters in 'TCL05' mode in response to an activation of the first test mode signal TCL05 under control of the test device 200. When the test device 200 provides a system clock CLK of a low frequency to the semiconductor device 100, the test device 200 provides the read command RD synchronized with the first rising edge of the system clock CLK to the semiconductor device 100. The semiconductor device 100 outputs the first read data D1 synchronized with the first falling edge of the system clock CLK after a predetermined CAS latency (CL), which is corresponding to a half period of the system clock CLK, passes from a providing time of the read command RD.

Hereinafter, detailed operation of the semiconductor device 100 will be described as below with reference to FIG. 12 and FIG. 2.

If the read command RD is inputted to the semiconductor device 100, the first output control unit 131 generates the first Internal control signal PINB the second internal control signals RPOUTB corresponding to the first rising edge of the system clock CLK, and the second output control unit 133 generates the first internal clock RCLKDO toggled corresponding to the first falling edge of the system clock CLK. The first output control unit 131 generates the third internal control signals RORDER<0:3> in response to the second test mode signal TMORDER<0:1> before the Input of the read command RD.

If the read command RD is inputted to the semiconductor device 100, the memory region 110 transfers the first to eighth internal data to the first to eighth global lines GIO_O<0:7>. The serialization unit 121 aligns the first to eighth internal data loaded on the first to eighth global lines GIO_O<0:7> in response to the first internal control signal PINB, and outputs in series aligned first to eighth internal data as the serial data RDO in response to the second and third internal control signals RPOUTB and RORDER<0:3>. The data output unit 123 synchronizes the serial data RDO outputted from the serialization unit 121 with the first internal clock RCLKDO and outputs the first read data D1.

Thus, the first read data D1 is outputted through the data output pad DQ after the CAS latency (CL) corresponding to a half period of the system clock passes from when the read command RD is inputted.

As described above, an output time of the first read data D1 In the 'TCL05' mode is prior to that in the 'TCL10' mode by a half period of the system clock CLK.

Hereinafter, a method for detecting the address access time (tAA) of the semiconductor device is described based on the read operation of the semiconductor device 100 according to the 'TCL05' mode.

Referring to FIG. 13 and FIG. 1, the test device 200 generates a system clock CLK of which a falling edge is put forward by a predetermined level at every operation cycle. That is, the test device 200 provides the read command RD to the semiconductor device 100, and generates the system clock of which the falling edge is put forward by the predetermined level whenever the first read data is provided from the semiconductor device 100.

The semiconductor device 100 generates the internal clocks RCLKDO and FCLKDO of which a rising edge is put forward by the predetermined level in response to the system clock CLK, and provides the read data DOUT synchronized with the internal clocks RCLKDO and FCLKDO to the test device 200. Herein, a valid output data window (tDV) corresponding to the first Internal clock RCLKDO expands at every read operation cycle, and the first read data D1 having an unexpected value is outputted in the end. That is, the valid output data window (tDV) of the first read data D1 expands by a timing margin between the data aligned on the first pipe latch unit 121_3 and the rising edge of the first internal clock RCLKDO. The first read data D1 having the unexpected value is outputted from when the timing margin becomes zero.

More specifically, referring to FIG. 14 and FIG. 2, as the falling edge of the system clock CLK is put forward, the valid output data window (tDV) of the first read data expands. Herein, the valid output data window (tDV) of the first read data D1 does not expand any more if the first read data D1 having the unexpected value is outputted.

Thus, the test device 200 detects the address access time (tAA) of the semiconductor device by monitoring the valid output data window (tDV) of the first read data D1 or a time (tAC) from the first falling edge of the system clock CLK to an output start of the first read data D1.

Meanwhile, in embodiments of the present invention, an address access time (tAA) for all global lines GIO_O<0:7> may be detected by controlling a burst sequence of the first to eighth internal control data loaded on the first to eighth global lines GIO_O<0:7> using the second test mode signal TMORDER<0:1>.

As described above, when a semiconductor device of a wafer level is tested, an address access time (tAA) of the semiconductor device may be detected. Moreover, the address access time (tAA) may be improved at the wafer level according to a specification using a fuse circuit.

While the present invention has been described with respect to the specific embodiments, it will be apparent to those skilled in the art that various changes and modifications may be made without departing from the spirit and scope of the invention as defined in the following claims.

For example, in embodiments of the present invention, it is exemplarily described that the test device 200 provides the system clock CLK of which the falling edge is put forward by the predetermined level at every read operation cycle. However, the semiconductor device may be designed to generate the internal clock RCLKDO of which the rising edge is put forward by the predetermined level at every read operation cycle in response to the system clock CLK toggled regularly.

What is claimed is:

1. A semiconductor device, comprising:
   a memory region suitable for providing a plurality of read data in parallel at every read operation cycle;
   an output path suitable for outputting the plurality of read data at a set time in response to an internal clock and one or more internal control signals at the every read operation cycle; and
   an output path control unit suitable for generating the internal control signal in response to a read command and generating the internal clock in response to a system clock, wherein a shifting time of a first edge of the internal clock is adjusted by a set level at the every read operation cycle during a test mode,
   wherein the output path comprises:
      a serialization unit suitable for outputting in series the plurality of read data in response to the internal control signal at the every read operation cycle, and outputting only first read data of the plurality of read data in the test mode; and
      a data output unit suitable for synchronizing and outputting the read data outputted through the serialization unit with the internal clock and outputting synchronized data at the every read operation cycle.

2. The semiconductor device of claim 1, wherein the output path control unit generates the internal control signal of which an activation time is advanced in the test mode than in other modes.

3. The semiconductor device of claim 1, wherein the output path control unit comprises:
   a first output control unit suitable for generating the internal control signal in response to the read command and the system clock, and adjusting the activation time of the internal control signal in response to a first test mode signal and a second test mode signal; and
   a second output control unit suitable for generating the internal clock in response to the first test mode signal and the system clock.

4. The semiconductor device of claim 1, wherein the read data are outputted at the set time in response to the first edge of the internal clock.

5. The semiconductor device of claim 3, wherein the serialization unit comprises:
   a first multiplexing unit suitable for selectively outputting first data from the plurality of read data provided by the memory region;
   a first pipe latch unit suitable for latching the first data outputted from the first multiplexing unit in response to a first one of the internal control signals, and outputting first latched data in response to a second one of the internal control signals;
   a second multiplexing unit suitable for transferring in series the first latched data outputted from the first pipe latch unit to the data output unit in response to a third one of the internal control signals;
   a third multiplexing unit suitable for selectively outputting second data from the plurality of read data;
   a second pipe latch unit suitable for latching the second data outputted from the third multiplexing unit in response to the first internal control signal, and outputting second latched data in response to a fourth one of the internal control signals; and
   a fourth multiplexing unit suitable for transferring in series the second latched data outputted from the second pipe latch unit to the data output unit in response to a fifth one of the internal control signals.

6. The semiconductor device of claim 5, wherein the first output control unit comprises:
   a latch input control unit suitable for generating the first internal control signal in response to a first internal command and the system clock, wherein the first internal command is generated from the read command and synchronized with the system clock;
   a latch output control unit suitable for generating the second and fourth internal control signals in response to the first test mode signal, a delay locking clock, a second internal command and a third internal command, wherein the delay locking clock is generated from the system clock by reflecting an internal delay element thereto, the second internal command is generated from the read command and synchronized with the delay locking clock, and the third internal command is generated from the read command and synchronized with the system clock; and
   an output sequence control unit suitable for generating the third and fifth internal control signals in response to a seed address, the first test mode signal and the second test mode signal.

7. The semiconductor device of claim 6, wherein the latch output control unit comprises:
   a first logic operation unit suitable for performing a logic operation on the second internal command and a first clock corresponding to a first edge of the delay locking clock, and outputting a first logic operation signal;
   a second logic operation unit suitable for performing a logic operation on the third internal command and a second clock corresponding to a second edge of the delay locking clock, and outputting a second logic operation signal;
   a fifth multiplexing unit suitable for selectively outputting one of the first logic operation signal and the second logic operation signal in response to the first test mode signal; and
   a shifting unit suitable for generating the second internal control signal and the fourth internal control signal in response to an output signal of the fifth multiplexing unit.

8. The semiconductor device of claim 6, the output sequence control unit comprises:
   an address decoder suitable for decoding the seed address;
   a test decoder suitable for decoding the second test mode signal in response to the first test mode signal; and
   a selection output unit suitable for outputting first and second code signals outputted from the address decoder or a common code signal outputted from the test decoder as the third and fifth internal control signals in response to the first test mode signal.

9. The semiconductor device of claim 5, wherein the data output unit comprises:
   a data trigger unit suitable for synchronizing the first and second latched data with first and second internal clocks, which are corresponding to first and second edges of the internal clock, respectively, and outputting synchronized read data in response to an output control signal; and an output driver suitable for driving the synchronized read data outputted from the data trigger unit to an external pad.

10. The semiconductor device of claim 9, wherein the second output control unit comprises:

a first internal clock generation unit suitable for generating the first internal clock in response to the first test mode signal, a first output enable signal and a delay locking clock, which is generated from the system clock by reflecting an internal delay element thereto;

a second internal clock generation unit suitable for generating the second internal clock in response to the first test mode, a second output enable signal, and the delay locking clock; and an output control unit suitable for generating the output control signal in response to the first test mode signal and the first and second output enable control signals.

11. The semiconductor device of claim 10, wherein the first internal clock generation unit comprises:

a sixth multiplexing unit suitable for selectively outputting one of a first clock corresponding to a first edge of the delay locking clock and a second clock corresponding to a second edge of the delay locking clock in response to the first test mode signal;

a seventh multiplexing unit suitable for selectively outputting one of the first output enable signal and a third output enable signal, which is delayed more than the first output enable signal by a set period, in response to the first test mode signal; and a third logic operation unit suitable for performing a logic operation on output signals of the sixth and seventh multiplexing units, and generating the first internal clock.

12. The semiconductor device of claim 11, wherein the second internal clock generation unit comprises:

an eighth multiplexing unit suitable for selectively outputting the other of the first clock and the second clock in response to the first test mode signal;

a ninth multiplexing unit suitable for selectively outputting one of the second output enable signal and a fourth output enable signal, which is delayed more than the second output enable signal by a set period, in response to the first test mode signal; and a fourth logic operation unit suitable for performing a logic operation on output signals of the eighth and ninth multiplexing units, and generating the second internal clock.

* * * * *